(12) United States Patent
Sawachi

(10) Patent No.: US 12,170,187 B2
(45) Date of Patent: Dec. 17, 2024

(54) GAS SUPPLY SYSTEM, PLASMA PROCESSING APPARATUS, AND GAS SUPPLY METHOD

(71) Applicant: Tokyo Electron Limited, Tokyo (JP)

(72) Inventor: Atsushi Sawachi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 154 days.

(21) Appl. No.: 18/098,313

(22) Filed: Jan. 18, 2023

(65) Prior Publication Data

US 2023/0230812 A1 Jul. 20, 2023

(30) Foreign Application Priority Data

Jan. 19, 2022 (JP) .................................. 2022-006593

(51) Int. Cl.
*H01J 37/32* (2006.01)

(52) U.S. Cl.
CPC .. *H01J 37/32449* (2013.01); *H01J 37/32623* (2013.01); *H01J 37/32816* (2013.01)

(58) Field of Classification Search
CPC ........... H01J 37/32449; H01J 37/32623; H01J 37/32816
See application file for complete search history.

(56) References Cited

U.S. PATENT DOCUMENTS

| 2018/0012735 A1* | 1/2018 | Sawachi | ............... G05D 11/133 |
| 2021/0013012 A1* | 1/2021 | Sawachi | ........... H01J 37/32449 |
| 2021/0043425 A1* | 2/2021 | Sawachi | ........... C23C 16/45544 |

FOREIGN PATENT DOCUMENTS

JP 2005-000723 A 1/2005

\* cited by examiner

*Primary Examiner* — Kevin R Barss
(74) *Attorney, Agent, or Firm* — Nath, Goldberg & Meyer; Jerald L. Meyer; Tanya E. Harkins

(57) ABSTRACT

A system includes: gas supply flow paths for supplying independently a main gas to a processing chamber; a flow rate control valve disposed in each gas supply flow path; an additive-gas flow path connected to the flow rate control valve; a valve for addition disposed in the additive-gas flow path; and a controller for controlling the flow rate control valve and the valve for addition to execute controls of: calculating flow rates of the main gas and an additive gas to be mixed with the main gas; calculating a total of the flow rates; calculating an internal pressure of each gas supply flow path with the total flow rate, and first and second relationships between previously acquired gas flow rates and gas pressures of the main gas and the additive gas, respectively; calculating an internal pressure ratio; and proportionally controlling openings of flow rate control valves based on the ratio.

17 Claims, 5 Drawing Sheets

GAS SUPPLY SYSTEM, PLASMA PROCESSING APPARATUS, AND GAS SUPPLY METHOD

CROSS-REFERENCE TO RELATED APPLICATION

This application claims priority to Japanese Patent Application No. 2022-006593, filed on Jan. 19, 2022, the entire contents of which are incorporated herein by reference.

TECHNICAL FIELD

The present disclosure relates to a gas supply system, a plasma processing apparatus, and a gas supply method.

BACKGROUND

Patent Document 1 discloses a pressure division control system that includes two valves for variably controlling a working gas, a pressure sensor connected in series to each of the valves to detect a pressure of the working gas, and a controller that relatively controls an output pressure of each valve based on a detection result of the pressure sensor.

PRIOR ART DOCUMENT

Patent Document

Patent Document 1: Japanese Laid-Open Patent Publication No. 2005-000723

SUMMARY

According to an aspect of the present disclosure, a gas supply system for supplying a gas into a processing chamber includes: a plurality of gas supply flow paths configured to supply independently a main gas to the processing chamber; a flow rate control valve disposed in each of the plurality of gas supply flow paths; an additive gas flow path connected to a downstream side of the flow rate control valve in at least one of the plurality of gas supply flow paths; a valve for addition disposed in the additive gas flow path; and a controller for controlling operations of the flow rate control valve and the valve for addition, wherein the controller executes: a control of calculating a flow rate of the main gas flowing through each of the plurality of gas supply flow paths; a control of acquiring a flow rate of an additive gas that flows through the additive gas flow path and is mixed with the main gas flowing through each of the plurality of gas supply flow paths; a control of calculating a total flow rate of the flow rate of the main gas and the flow rate of the additive gas, in each of the plurality of gas supply flow paths; a control of calculating an internal pressure of each of the plurality of gas supply flow paths by using the total flow rate calculated in each of the plurality of gas supply flow paths, a first relationship between a previously-acquired gas flow rate and a previously-acquired gas pressure of the main gas, and a second relationship between a previously-acquired gas flow rate and a previously-acquired gas pressure of the additive gas; a control of calculating a ratio of the internal pressures calculated in each of the plurality of gas supply flow paths; and a control of proportionally controlling openings of a plurality of flow rate control valves based on the ratio of the internal pressures.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
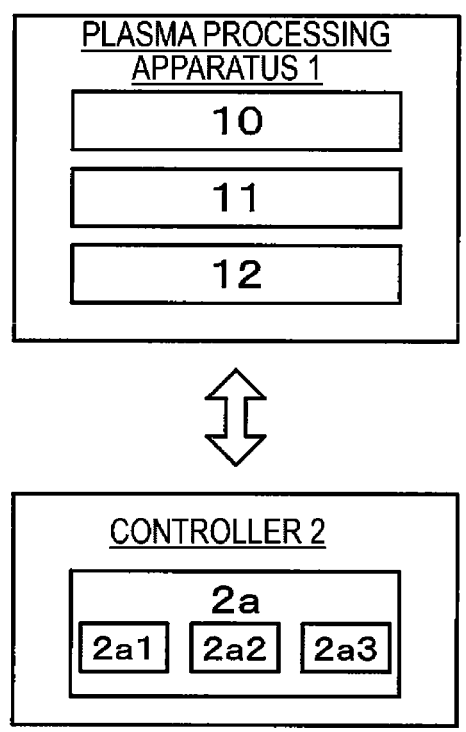
FIG. 1 is an explanatory diagram illustrating a configuration example of a wafer processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a process of manufacturing a semiconductor device, various types of gas processing such as etching processing, film formation processing, and cleaning processing under a desired gas atmosphere are performed for a semiconductor substrate (hereinafter, simply referred to as a "substrate") disposed in an inner space of a chamber. In the gas processing, in order to obtain a desired processing result for the substrate of a processing target, it is important to independently control supply of gases to a plurality of regions on the substrate so as to accurately control a flow rate of each gas supplied to the plurality of regions.

Patent Document 1 discloses a pressure division control system for uniformly controlling a flow rate of a working gas supplied to each of two different regions on a substrate, specifically, a central region and a peripheral (edge) region. The pressure division control system described in Patent Document 1 detects gas pressures output from two valves disposed respectively corresponding to the central region and the edge region, and proportionally controls steps of the two valves based on the detection results, thereby, relatively controlling output pressures of the two valves (pressure ratio control).

During the gas processing, another processing gas (hereinafter, referred to as an "additive gas") for the purpose of assisting the gas processing (for example, improving efficiency or the like) may be mixed with a main processing gas (hereinafter, referred to as a "main gas") used for the gas processing. The additive gas may be independently mixed with each part of the main gas supplied to each of the plurality of regions described above. In other words, the supply of the additive gas to each of the plurality of regions on the substrate described above may be independently controlled.

By the way, in a case where the additive gas is mixed with the main gas in the gas processing, it is necessary to perform a gas flow rate control in consideration of the additive gas in order to obtain a desired gas processing result for the substrate. That is, for example, the pressure-controlled flow rate control system as described in Patent Document 1 needs to perform a gas flow rate control by considering the amount of pressure increase when the additive gas is mixed. However, Patent Document 1 does not describe consideration of the pressure increase due to the additive gas during the flow rate control, and much less describes mixing the additive gas with the main gas.

The technology according to the present disclosure is made in consideration of the above-described circumstances, and a gas may be appropriately supplied into a processing chamber in consideration of the influence of an additive gas mixed into a main gas. Hereinafter, a substrate processing system according to the present embodiment will be described with reference to the drawings. The same reference numerals will be given to elements having substantially the same functional configurations throughout the specification and the drawings, and redundant description thereof will be omitted.

<Plasma Processing System>

In one embodiment, a plasma processing system includes a plasma processing apparatus 1 and a controller 2 as illustrated in FIG. 1. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 includes at least one gas supply port for supplying at least one processing gas into the plasma processing space, and at least one gas exhaust port for exhausting the processing gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 200 kHz to 150 MHz.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2a. For example, the computer 2a may include a processor (central processing unit (CPU)) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN). The program may be recorded in a storage medium readable by the computer 2a and may be installed in the controller 2 from the storage medium. Further, the storage medium may be temporary or non-temporary medium.

<Plasma Processing Apparatus>

Figure 2:
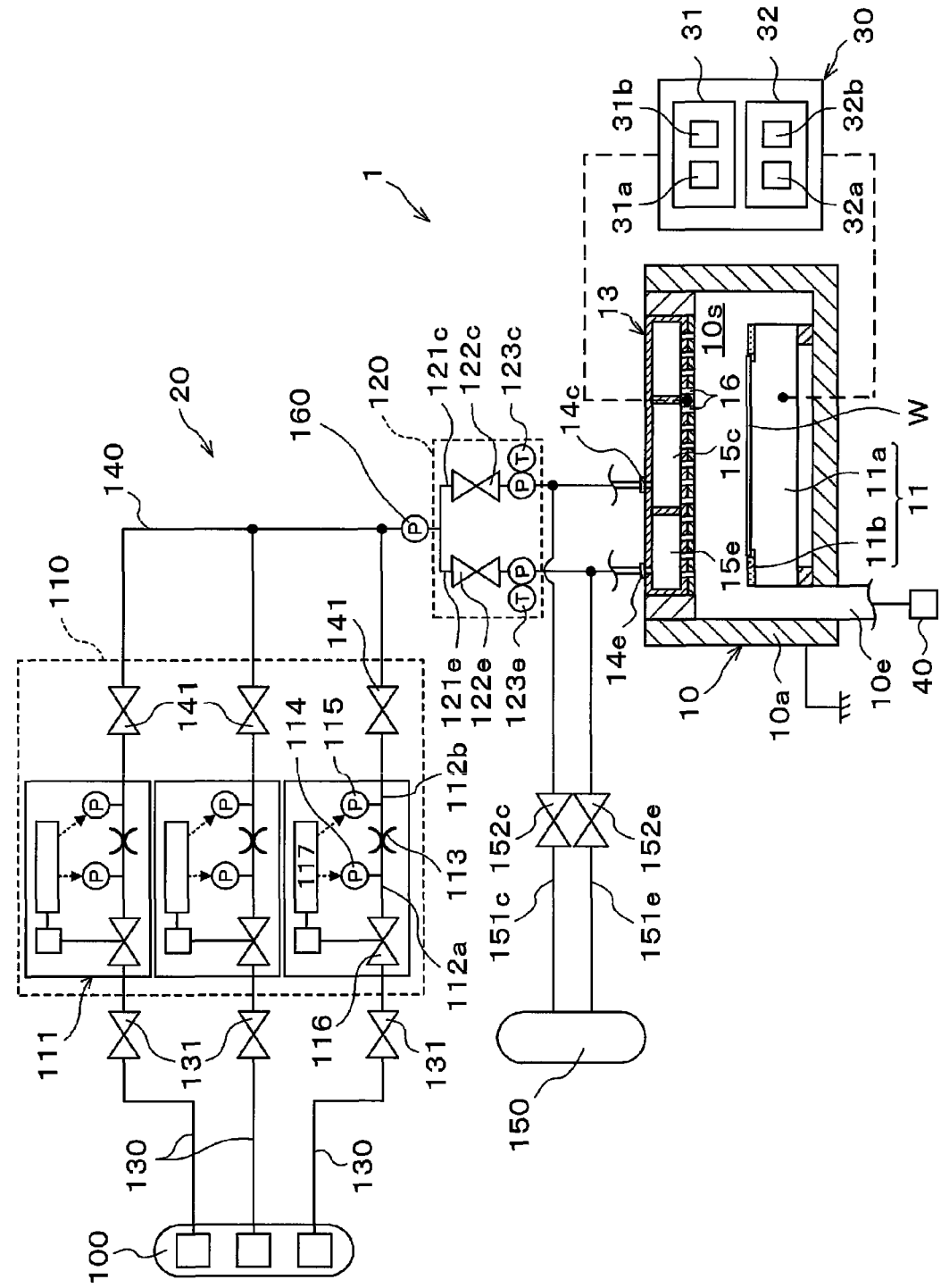
FIG. 2 is a cross-sectional view illustrating a configuration example of a plasma processing apparatus according to an embodiment.

Subsequently, as an example of the plasma processing apparatus 1 described above, a configuration example of a capacitively-coupled plasma processing apparatus 1 will be described. FIG. 2 is a vertical cross-sectional view illustrating a schematic configuration of the plasma processing apparatus 1. In the following description, a main gas box 100 side to be described below in a flow direction of a processing gas may be referred to as a primary side (an upstream side), and a shower head 13 (plasma processing chamber 10) side to be described below in the flow direction may be referred to as a secondary side (a downstream side).

The plasma processing apparatus 1 includes a plasma processing chamber 10, a gas supply 20, a power source 30, and an exhaust system 40. Further, the plasma processing apparatus 1 includes a substrate support 11 and a gas introducer. The substrate support 11 is disposed in the plasma processing chamber 10. The gas introducer is configured to introduce at least one processing gas into the plasma processing chamber 10. The gas introducer includes a shower head 13. The shower head 13 is disposed above the substrate support 11. In one embodiment, the shower head 13 constitutes at least a portion of a ceiling of the plasma processing chamber 10. A plasma processing space 10s defined by the shower head 13, a sidewall 10a of the plasma processing chamber 10, and the substrate support 11 is formed inside the plasma processing chamber 10. The plasma processing chamber 10 is grounded. The shower head 13 and the substrate support 11 are electrically insulated from the plasma processing chamber 10.

The substrate support 11 includes a main body portion 11a and a ring assembly 11b. An upper surface of the main body portion 11a includes a central region (a substrate support surface) for supporting a substrate (wafer) W, and an annular region (a ring support surface) for supporting the ring assembly 11b. The wafer is an example of the substrate W. The annular region surrounds the central region in a plan view. The substrate W is disposed on the central region, and the ring assembly 11b is disposed on the annular region to surround the substrate W on the central region.

In one embodiment, the main body portion 11a includes a base and an electrostatic chuck. The base includes a conductive member. The conductive member of the base may function as a lower electrode. The electrostatic chuck is disposed on the base. The electrostatic chuck includes a ceramic member and an electrostatic electrode disposed in the ceramic member. An upper surface of the ceramic member constitutes the central region (substrate support surface) and the annular region (ring support surface) described above. Other members that surround the electrostatic chuck, such as an annular electrostatic chuck or an annular insulating member, may have the annular region. In this case, the ring assembly may be disposed on the annular electrostatic chuck or the annular insulating member or may be disposed on both the electrostatic chuck and the annular insulating member. Further, at least one RF/DC electrode coupled to an RF power source 31 and/or a DC power source 32 to be described below may be disposed in the ceramic member. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base and at least one RF/DC electrode may function as a plurality of lower electrodes. Further, the electrostatic electrode may function as the lower electrode. Accordingly, the substrate support 11 includes at least one lower electrode.

The ring assembly 11b includes one or more annular members. In one embodiment, one or more annular members include one or more edge rings and at least one cover ring. The edge ring is formed of a conductive material or an insulating material, and the cover ring is formed of an insulating material.

Further, although not illustrated, the substrate support 11 may include a temperature control module configured to adjust at least one of the ring assembly 11b, the electrostatic chuck, and the substrate W to a target temperature. The temperature control module may include a heater, a heat transfer medium, a flow path, or a combination thereof. A heat transfer fluid, such as brine or gas, flows through the flow path. In one embodiment, a flow path is formed inside the base, and one or more heaters are disposed inside the ceramic member of the electrostatic chuck. Further, the substrate support 11 may include a heat transfer gas supply configured to supply a heat transfer gas (backside gas) to a gap between a rear surface of the substrate W and an upper surface of the electrostatic chuck.

The shower head 13 is configured to introduce at least one processing gas from the gas supply 20 into the plasma processing space 10s. Further, the shower head 13 includes at least one upper electrode.

The shower head 13 includes more than one (two, in the present embodiment) gas supply ports 14c and 14e, more than one (two, in the present embodiment) gas diffusion chambers 15c and 15e, and more than one gas introduction holes 16. The gas supplied from the gas supply 20 to the gas supply port 14c passes through the gas diffusion chamber 15c and is supplied from the more than one gas introduction holes 16 toward a central portion (center) region of the substrate W supported by the substrate support 11. The gas supplied from the gas supply 20 to the gas supply port 14e passes through the gas diffusion chamber 15e and is supplied from the more than one gas introduction holes 16 toward a peripheral portion (edge) region of the substrate W supported by the substrate support 11.

The number of gas supply ports 14 and the number of gas diffusion chambers 15 formed in the shower head 13 are not limited thereto.

For example, in a case where the shower head 13 is provided with three gas supply ports 14 and three gas diffusion chambers 15, a processing gas from the gas supply 20 may be supplied toward a central region of the substrate W, an edge region thereof, and an intermediate portion (middle) region between the central region and the edge region.

For example, in a case where the shower head 13 is provided with four gas supply ports 14 and four gas diffusion chambers 15, the processing gas from the gas supply 20 may be supplied toward the central region of the substrate W, the middle region thereof, the edge region thereof, and an outer end portion (belly edge) region outside the edge region.

Thus, gas supply ports 14 and gas diffusion chambers 15 may be formed in the shower head 13 by any number of more than one, that is, two or more. Further, in this case, disposition of the more than one gas supply ports 14 and gas diffusion chambers 15 may also be designed optionally.

The gas introducer may include, in addition to the shower head 13, one or a plurality of side gas injectors (SGI) that are attached to one or a plurality of openings formed in the sidewall 10a.

The gas supply 20 includes a main gas box 100 that includes more than one gas sources (not numbered), a flow rate control unit 110 that controls a flow rate of a processing gas supplied from the main gas box 100, and a splitter 120 that splits a main gas output from the flow rate control unit 110. In one embodiment, the gas supply 20 is configured to mix the respective flow rates of different types of processing gases output from the more than one gas sources provided in the main gas box 100 after being controlled by the flow rate control unit 110 and to supply the mixed gas, as the main gas, to the shower head 13 (plasma processing chamber 10) through the splitter 120.

As illustrated in FIG. 2, the flow rate control unit 110 is connected to the main gas box 100 through primary-side supply pipes 130 as gas supply flow paths. Further, primary-side valves 131 are respectively disposed in the primary-side supply pipes 130; it is configured that the supply of a gas from each gas source of the main gas box 100 to the flow rate control unit 110 may be optionally switched by opening and closing of the primary-side valves 131. Any type of valve such as an air-operated valve or an electromagnetic valve may be employed for the primary-side valve 131. For example, the electromagnetic valve may preferably be employed from the standpoint of improving responsiveness relating to the gas supply.

The flow rate control unit 110 includes more than one (three, in the illustrated example) flow rate controllers 111 respectively corresponding to more than one (three, in the illustrated example) gas sources provided in the main gas box 100. The three flow rate controllers 111 are respectively connected to end portions of the primary-side supply pipes 130 extending from the respective gas sources of the main gas box 100. Since configurations of the three flow rate controllers 111 included in the flow rate control unit 110 are the same as each other, the configuration of one flow rate controller 111 will be described as a representative in the following description. Further, numbering may be omitted in some components of the flow rate controller 111 as well as numbering in the drawings.

The flow rate controller 111 includes an internal supply pipe 112, an orifice 113, two pressure sensors 114 and 115, a control valve 116 as a flow rate control valve, and a control circuit 117. Further, the internal supply pipe 112 includes a primary-side internal supply pipe 112a on an upstream side and a secondary-side internal supply pipe 112b on a downstream side via the orifice 113 as a boundary.

A primary side of the primary-side internal supply pipe 112a is connected to the primary-side supply pipe 130 described above, and a secondary side thereof is connected to the orifice 113. Further, a primary side of the secondary-side internal supply pipe 112b is connected to the orifice 113, and a secondary side thereof is connected to a secondary-side supply pipe 140 described below. In other words, the orifice 113 is provided between the primary-side internal supply pipe 112a and the secondary-side internal supply pipe 112b.

The two pressure sensors 114 and 115 measure respectively an internal pressure of the primary-side internal supply pipe 112a and an internal pressure of the secondary-side internal supply pipe 112b, that is, a pressure on an upstream side of the orifice 113 and a pressure on a downstream side thereof.

An opening of the control valve 116 is controlled by the control circuit 117 to control a flow rate of the main gas supplied into the plasma processing chamber 10 (shower head 13) through the internal supply pipe 112. Specifically, the control circuit 117 controls the opening of the control valve 116 to adjust the internal pressure of the primary-side internal supply pipe 112a, and controls such that the flow rate of the main gas flowing a downstream side (secondary-side internal supply pipe 112b) of the orifice 113 is maintained at a desired value determined according to the purpose of the substrate processing in the plasma processing chamber 10.

Further, the control valve 116 may function as a flow rate modulation device that modulates or pulses the flow rate of the main gas under the control of the control circuit 117.

The description will be back to the gas supply 20.

The flow rate controllers 111 are connected to the splitter 120 respectively through the secondary-side supply pipes 140. The splitter 120 includes: branch supply pipes 121c and 121e provided respectively to correspond to the gas supply ports 14c and 14e of the shower head 13; control valves 122c and 122e provided respectively to correspond to the branch supply pipes 121c and 121e; and sensor groups 123c and 123e provided respectively to correspond to the branch supply pipes 121c and 121e.

Primary sides of the branch supply pipes 121c and 121e are connected to the secondary-side supply pipes 140 described above, and secondary sides thereof are respectively connected to the gas supply ports 14c and 14e of the shower head 13. In other words, the shower head 13 is connected to the secondary-side supply pipes 140 through the splitter 120.

The sensor groups 123c and 123e each include, as an example, a pressure sensor and a temperature sensor as illustrated in the drawing. The sensor groups 123c and 123e measure internal pressures and internal temperatures of the branch supply pipes 121c and 121e, respectively. More specifically, the sensor groups 123c and 123e measure internal pressures and internal temperatures on downstream sides of control valves 122c and 122e described below, respectively.

The control valves 122c and 122e are provided to correspond to the branch supply pipes 121c and 121e, respectively. Openings of the control valves 122c and 122e are controlled by a control circuit (not illustrated) to control flow rates of the main gases supplied respectively to the gas diffusion chambers 15c and 15e of the shower head 13 through the branch supply pipes 121c and 121e. Specifically, the control circuits respectively provided in the branch supply pipes 121c and 121e proportionally control openings of the respective control valves 122c and 122e based on pressure ratios (more specifically, pressure ratios of the gas diffusion chambers 15c and 15e) of the branch supply pipes 121c and 121e measured by the respective sensor groups 123c and 123e. Then, in this way, flow rates of the main gas supplied from the splitter 120 to the respective gas supply ports 14c and 14e (a central region and an edge region of the substrate W) of the shower head 13 are relatively controlled.

Further, in one embodiment, end portions of additive gas supply pipes 151c and 151e as additive gas flow paths are respectively connected to the branch supply pipes 121c and 121e on a downstream side of the respective corresponding control valves 122c and 122e. An additive gas box 150 is connected to the other end portion of the additive gas supply pipe 151. In other words, the additive gas from the additive gas box 150 may be further mixed with the main gas supplied from the gas supply 20 to the shower head 13 through the flow rate control unit 110 and the splitter 120.

Further, corresponding valves for addition 152c and 152e are respectively disposed in the additive gas supply pipes 151c and 151e; it is configured that mixing of the additive gas with the main gas supplied to the respective gas supply ports 14c and 14e of the shower head 13 may be optionally switched by opening and closing of the valve for addition 152. Any type of valve such as an air-operated valve or an electromagnetic valve may be used as the valve for addition 152. For example, the electromagnetic valve may preferably be used from the standpoint of improving responsiveness relating to the gas supply.

The additive gas box 150 may include at least one gas source and at least one flow rate controller. In one embodiment, the additive gas box 150 is configured to supply at least one processing gas as an additive gas from a corresponding gas source to the shower head 13 through a corresponding flow rate controller. Each flow rate controller 22 may include, for example, a mass flow controller or a pressure-controlled flow rate controller.

In one embodiment, an operation of the gas supply 20 is controlled by the controller 2 described above. Specifically, for example, the controller 2 is configured to be capable of independently controlling openings of various valves (primary-side valve 131, secondary-side valve 141, and valve for addition 152) included in the gas supply 20. Thus, the gas supply 20 controls the type of the processing gas mixed with the main gas supplied to the gas supply ports 14c and 14e, independently controls the supply of the main gas from the splitter 120 to the gas supply ports 14c and 14e, and independently controls mixing of the additive gases from the additive gas supply pipes 151c and 151e to the respective branch supply pipes 121c and 121e.

A pressure sensor 160 for measuring an internal pressure of a primary side of the splitter 120, that is, the secondary-side supply pipe 140 may be provided on the primary side of the splitter 120.

The description will be back to the plasma processing apparatus 1.

The power source 30 includes a radio-frequency (RF) power source 31 coupled to the plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10s. Accordingly, the RF power source 31 may function as at least a part of the plasma generator 12. Further, supplying the bias RF signal to at least one lower electrode may generate a bias potential in the substrate W to attract an ionic component in the formed plasma to the substrate W.

In one embodiment, the RF power source 31 includes a first RF generator 31a and a second RF generator 31b. The first RF generator 31a is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31a may be configured to generate a plurality of source RF signals having different frequencies. The generated one or more source RF signals are supplied to at least one lower electrode and/or at least one upper electrode.

The second RF generator 31b is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31b may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to at least one lower electrode to generate a first DC signal. The generated first DC signal is applied to at least one lower electrode. In one embodiment, the second DC generator 32b is configured to be connected to at least one upper electrode to generate a second DC signal. The generated second DC signal is applied to at least one upper electrode.

In various embodiments, the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32a and at least one lower electrode. Accordingly, the first DC generator 32a and the waveform generator constitute a voltage pulse generator. In a case where the second DC generator 32b and the waveform generator constitute the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure inside the plasma processing space 10s is adjusted by the pressure adjusting valve. The vacuum pump may include a turbo molecular pump, a dry pump, or a combination thereof.

While various exemplary embodiments have been described above, various additions, omissions, substitutions and changes may be made without being limited to the exemplary embodiments described above. Indeed, the embodiments described herein may be embodied in a variety of other forms.

For example, the above embodiment describes a case where the splitter 120 in the gas supply 20 includes the branch supply pipe 121, the control valve 122, and the sensor group 123. However, the configuration of the splitter 120 is not limited thereto, and for example, the sensor group 123 may be provided outside the splitter 120, that is, between the splitter 120 in the branch supply pipes 121c and 121e and the shower head 13.

Flow Rate Control Method

The plasma processing apparatus 1 according to the present embodiment is configured as described above.

In the plasma processing apparatus 1, a main gas from the main gas box 100 is supplied to the gas diffusion chambers 15c and 15e of the shower head 13 through the flow rate control unit 110 and the splitter 120. The flow rate controller 111 relatively controls a flow rate of the processing gas output from each of the gas sources of the main gas box 100, in other words, a flow rate of each of the processing gases mixed as the main gas.

Further, an additive gas from the additive gas box 150 may be independently mixed with the main gas that is output from the flow rate controller 111 and supplied to each of the gas diffusion chambers 15c and 15e through the splitter 120.

The processing gases (main gas and additive gas) supplied to the gas diffusion chambers 15c and 15e are respectively supplied toward a central region and an edge region of the substrate W held by the substrate support 11, whereby desired gas processing is performed on the substrate W.

Subsequently, a method of controlling a flow rate of the main gas supplied from the gas supply 20 to each of the gas diffusion chambers 15c and 15e will be described in detail.

Figure 3:
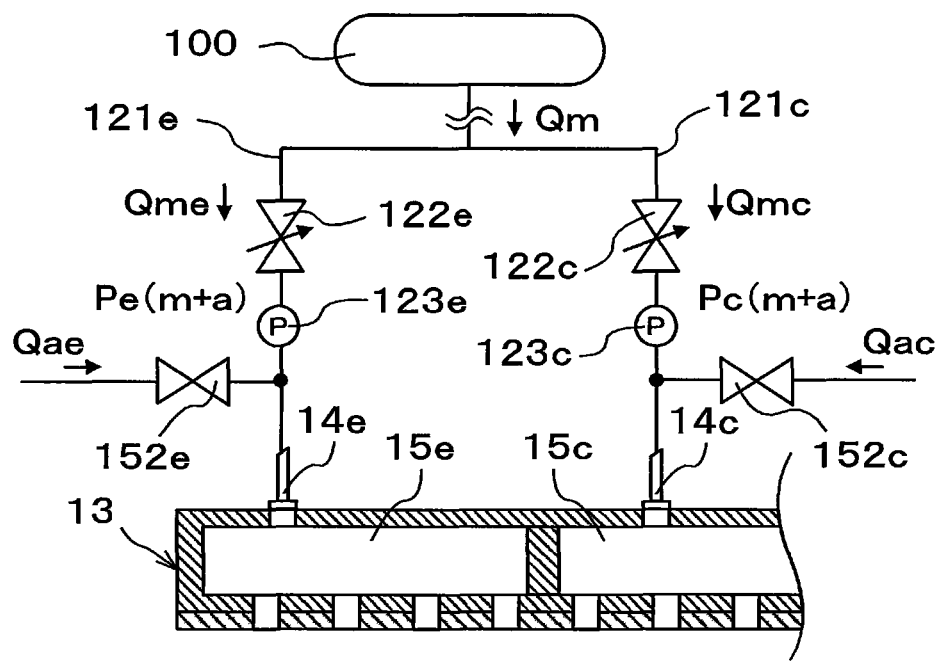
FIG. 3 is a schematic explanatory view illustrating main components of a gas supply in FIG. 2.

FIG. 3 is a schematic explanatory view showing main components in the gas supply 20 illustrated in FIG. 2 on an enlarged scale, and flow rates Q and pressures P of various processing gases used in the following description are plotted at the corresponding positions.

In order to control a flow rate of the main gas that is split and output in the splitter 120, PQ characteristics (hereinafter, referred to as "reference PQ characteristics") that serve as a reference for calculating the flow rate of the main gas are acquired, prior to gas processing of the plasma processing apparatus 1, for example, at the time of start-up (setup) of the plasma processing apparatus 1 (step St0-1 in FIG. 4). The acquired reference PQ characteristics are output to the controller 2.

In the technology according to the present disclosure, the term "PQ characteristics" are characteristics indicating a relationship between a gas flow rate Q and a gas pressure P in one gas (for example, the one main gas or the one additive gas described above) and may also be referred to as "pressure flow-rate characteristics".

The reference PQ characteristics indicate a relationship between the flow rate Q and the pressure P when a nitrogen ($N_2$) gas serving as a reference gas is supplied from the main gas box 100 to the plasma processing apparatus 1 (shower head 13).

Thus, the reference PQ characteristics are obtained based on the relationship between the flow rate Q and the pressure P of the reference gas, and the flow rate Q and the pressure P of the reference gas may change due to influence of conductance of the shower head 13 (gas diffusion chamber 15). Further, the conductance of the shower head 13 (gas diffusion chamber 15) may change depending on, as an example, a shape of the gas diffusion chamber 15 or the number and shapes of the gas introduction holes 16 formed in the shower head 13.

From this standpoint, the reference PQ characteristics are acquired from each of a primary side of the splitter 120, a secondary side of the control valve 122c in the splitter 120 (gas diffusion chamber 15c side: the central region side), and a secondary side of the control valve 122e in the splitter 120 (gas diffusion chamber 15e side: the edge region side).

Figure 5A:
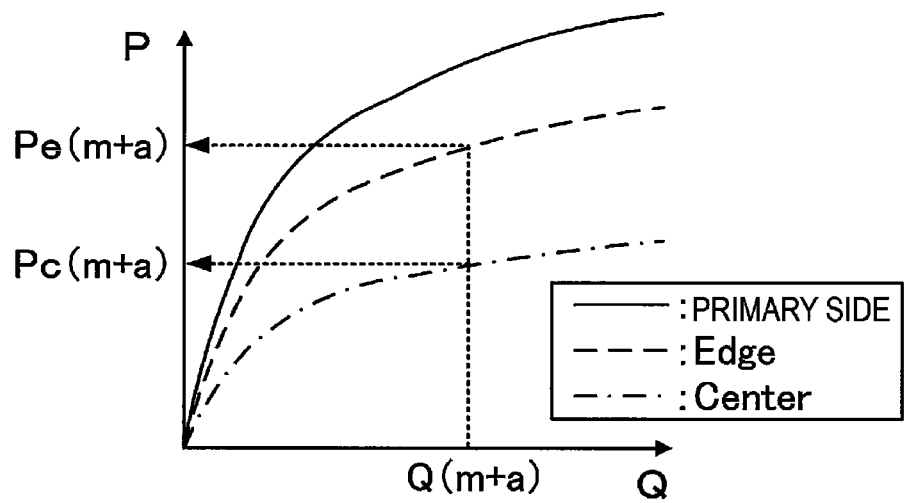
FIG. 5A is an explanatory graph illustrating an example of PQ characteristics.

FIG. 5A is a graph illustrating the reference PQ characteristics (a solid line in FIG. 5A) on the primary side of the splitter 120, the reference PQ characteristics (a dashed line in FIG. 5A) on the secondary side of the control valve 122e (an edge region side of the substrate W) in the splitter 120, and the reference PQ characteristics (an alternate long and short dash line in FIG. 5A) on the secondary side of the control valve 122c (a central region side of the substrate W) in the splitter 120.

The reference PQ characteristics at each location of the gas supply 20 may be automatically measured and further parameterized by the plasma processing apparatus 1. That is, an output of a main gas from the main gas box 100, measurements of the flow rate Q and the pressure P, acquisition of a PQ characteristics curve, and an output to the controller 2 may be automatically executed only by signaling start of acquisition of the reference PQ characteristics without an operation performed on the way by an operator.

Figure 4:
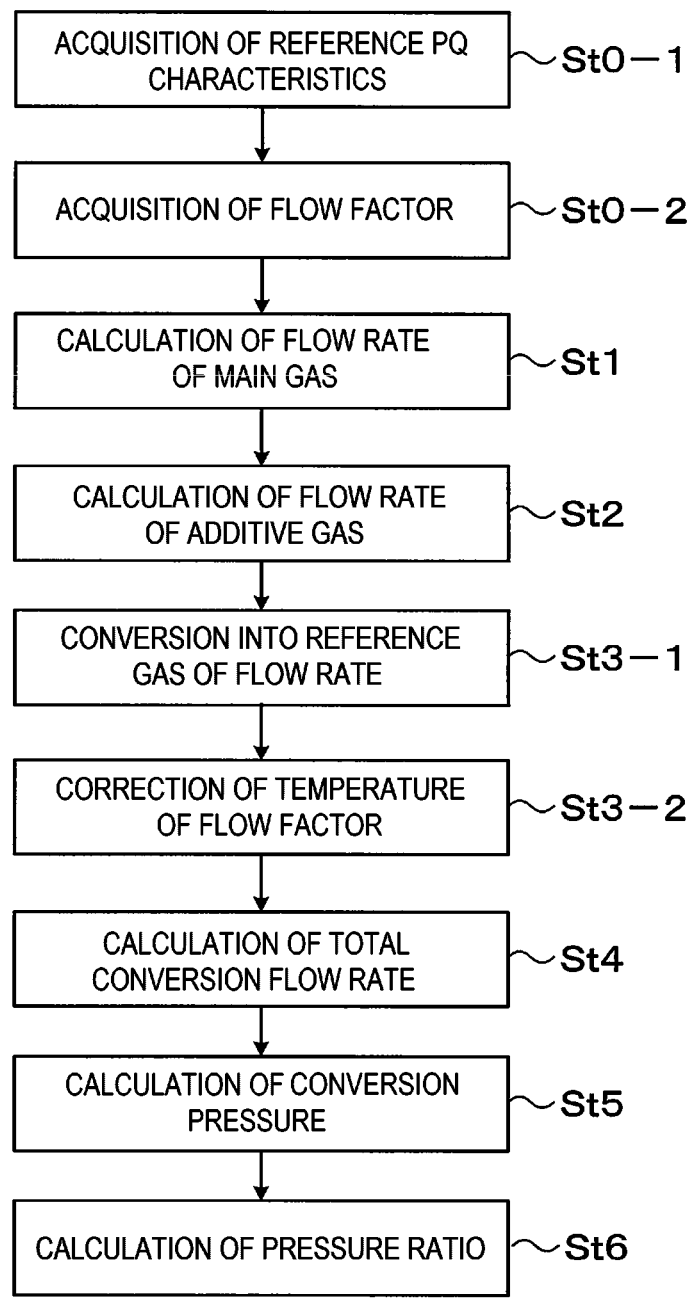
FIG. 4 is a flowchart illustrating main steps of a flow rate control according to an embodiment.

In order to control the flow rate of the main gas output from the splitter 120, flow factors of various processing gases used for gas processing are acquired prior to the gas processing of the plasma processing apparatus 1 (step St0-2 in FIG. 4). The acquired flow factors are output to the controller 2.

Figure 5B:
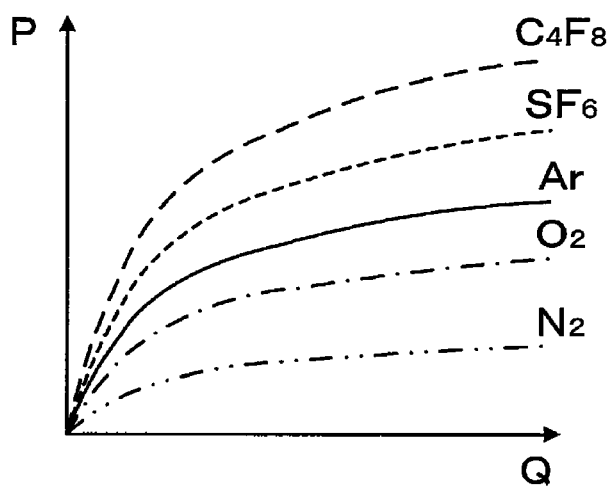
FIG. 5B is an explanatory graph illustrating an example of PQ characteristics of various gases.

The flow factor applied to the technology according to the present disclosure may be calculated based on PQ characteristics of various processing gases as illustrated in FIG. 5B and may be numerical values that indicate a change in flow rate indication due to the type of various processing gases relative to $N_2$ serving as a reference gas. That is, the flow factors of the various processing gases may be relative constants, as an example, in a case where the flow rate indication (PQ characteristics) of $N_2$ serving as the reference gas is set to "1". The type of processing gases illustrated in FIG. 5B is an example, and the type of the processing gases used in the plasma processing apparatus 1 according to the embodiment is not limited to the illustrated example. The flow factors include characteristic values such as densities, specific heat ratios, and gas constants corresponding to $N_2$ and various processing gases. As an example, the flow factors may be coefficients defined by International Standard IEC60534-1 (corresponding to Japanese Industrial Standard JIS B 2005-1). The flow factors may be set as follows: a flow rate of an orifice is 1 in which a flow rate of air at a temperature of 60 degrees Fahrenheit (F) with a pressure differential of 1 psi is 1 gallon per minute.

When the reference PQ characteristics and the flow factors of the various processing gases are acquired as pre-preparation for the gas processing of the plasma processing apparatus 1, an operation of determining supply flow rates of the processing gases (main gas and additive gas) during the gas processing is then started.

In the operation of determining the supply flow rates of the processing gases, first, a type and a total flow rate Qm of the main gas output from the main gas box 100, and a supply flow ratio (Qmc/Qme) of the processing gases to each of a central region and an edge region necessary for obtaining a desired gas processing result for the substrate W are acquired (input) based on a process recipe of the gas processing.

The controller 2 calculates a main-gas flow rate Qmc output to the central region (gas diffusion chamber 15c) and a main-gas flow rate Qme output to the edge region (gas diffusion chamber 15e) based on the acquired total flow rate Qm of the main gas and the supply flow ratio (Qmc/Qme) (step St1 in FIG. 4).

Next, based on the process recipe of the gas processing, a flow rate of the additive gas output from the additive gas box 150, more specifically, the type and flow rate Qac of the additive gas mixed with the main gas output to the central region (gas diffusion chamber 15c), and the type and flow rate Qae of the additive gas mixed with the main gas output to the edge region (gas diffusion chamber 15e) are acquired (input) respectively (step St2 of FIG. 4).

Here, the splitter 120 proportionally controls openings of the control valves 122c and 122e respectively included in the branch supply pipes 121c and 121e based on a pressure ratio (Pc/Pe) of the processing gases supplied respectively to the gas diffusion chambers 15c and 15e of the shower head 13, thereby relatively controlling the main-gas flow rates Qmc and Qme that are output. However, in a case where the additive gas is mixed with the main gas as described above, and particularly, in a case where the types of the main gas and the additive gas are different from each other, there is a risk that a proportional control of a flow rate based on the pressure ratio may not be implemented appropriately depending on various conditions such as a difference in physical property value between the main gas and the additive gas to be mixed.

Therefore, in the present embodiment, the flow rate Qm of the main gas and the flow rate Qa of the additive gas both calculated in step S0 and step St2 are converted using the reference gas ($N_2$) by using the flow factors acquired in step St0-2 (step St3-1 in FIG. 4). Thereby, the pressure P of the processing gas (main gas+additive gas) serving as a reference for a flow rate control may be unified by a reference gas conversion, and as a result, the proportional control of the flow rate based on the pressure ratio may be appropriately implemented even when the types of the main gas and the additive gas are different.

In a case where a temperature difference occurs between the central region and the edge region of the substrate W to which the processing gas is supplied, such temperature dependency may be reflected in the flow factor used in step St3-1. In other words, the conversion flow rate $QmN_2$ of the main gas and the conversion flow rate $QaN_2$ of the additive gas gone through the reference gas conversion (step St3-1) may be finely adjusted/optimized by a temperature correction factor $\Delta T$ based on the temperature dependency of the flow factor (step St3-2 in FIG. 4). More specifically, as an example, according to the above-described flow factor at the reference temperature (for example, room temperature) of the $N_2$ gas being set to "1", the flow factors at various temperatures of the $N_2$ gas may be corrected.

Next, a total conversion flow rate $Q(m+a)N_2$, which is the total value of the conversion flow rate $QmN_2$ of the main gas and the conversion flow rate $QaN_2$ of the additive gas calculated in step St3, is calculated (step St4 of FIG. 4). The total conversion flow rate is independently calculated for each of the processing gases supplied to the central region and the edge region of the substrate W.

Next, a conversion pressure $Pc(m+a)N_2$ on the central region side and a conversion pressure $Pe(m+a)N_2$ on the edge region side that serve as a reference pressure for controlling the flow rate of the main gas are calculated based on the total conversion flow rate $Qc(m+a)N_2$ on the central region side and the total conversion flow rate $Qe(m+a)N_2$ on the edge region side which are calculated in step St4, and the reference PQ characteristics acquired in step St0-1 (step St5 in FIG. 4).

Subsequently, a pressure ratio $Pc/Pe=Pc(m+a)N_2/Pe(m+a)N_2=\alpha$ that serves as a reference for gas flow rate control in the splitter 120 is calculated based on the conversion pressure $P(m+a)N_2$ calculated in step St5 (step St6 in FIG. 4).

The pressure ratio a is a calculated value obtained by converting a pressure of the processing gas output from each of the branch supply pipes 121c and 121e, that is, a calculated value of an internal pressure of each of the branch supply pipes 121c and 121e.

The calculated pressure ratio α is output to the controller 2.

Thereafter, during the gas processing of the plasma processing apparatus 1, openings of the control valves 122c and 122e respectively corresponding to the branch supply pipes 121c and 121e are proportionally controlled based on the pressure ratio α thus calculated, whereby flow rates of the processing gases (main gas+additive gas) respectively supplied to the gas diffusion chambers 15c and 15e of the shower head 13 are relatively controlled.

More specifically, openings of the control valves 122c and 122e are adjusted such that a flow ratio Qc/Qe of the processing gas output from each of the branch supply pipes 121c and 121e substantially coincides with the pressure ratio α, that is, such that the flow ratio Qc/Qe=α.

Split flow of the processing gas performed by the splitter 120 according to the technology of the present disclosure, that is, flow rate control of the processing gas output from each of the branch supply pipes 121c and 121e is performed as described above.

During the gas processing of the plasma processing apparatus 1, it is preferable that a pressure on a downstream side of the splitter 120, that is, internal pressures of the branch supply pipes 121c and 121e (secondary-side pressures of the control valves 122c and 122e) each are lower than a pressure on an upstream side of the splitter 120, that is, an internal pressure of the secondary-side supply pipe 140 (primary-side pressures of the control valves 122c and 122e), or preferably, twice or less than the primary-side pressure.

In other words, in the flow rate control according to the technology of the present disclosure, it is preferable that the conversion pressure $P(m+a)N_2$ calculated in step ST5 is set to be lower than the total flow rate Qm in the process recipe of the gas processing, or preferably set to be twice or less than the primary-side pressure.

In a case where the internal pressures of the branch supply pipes 121c and 121e each are greater than or equal to the internal pressure of the secondary-side supply pipe 140, when the control valve 116 is opened in the gas processing, the processing gas may flow backward from the branch supply pipes 121c and 121e to the secondary-side supply pipe 140; thus, a matter may occur in the gas supply 20.

In this respect, in the present embodiment, backflows of the processing gases may be appropriately reduced by setting the conversion pressure $P(m+a)N_2$ to be lower than the total flow rate Qm.

At this time, pressures on the upstream side and the downstream side of the splitter 120 may be measured respectively by the pressure sensor 160 and the sensor groups 123c and 123e.

The pressure on the upstream side of the splitter 120 may be measured by use of the pressure sensor 115 of the flow rate controller 111 instead of the pressure sensor 160.

EXAMPLES

The split flow and flow rate control of the main gas according to the present disclosure are performed as described above.

Subsequently, a series of flow rate control methods described above will be described with calculation examples using specific numerical values. Types and flow rates of processing gases used in the following description are shown as examples. That is, the types and flow rates of the processing gases applied to the technology of the present disclosure are not limited to the following calculation examples. In the following calculation examples, it is assumed that the above-described reference PQ characteristics and flow factors are output in advance to the controller 2. That is, it is assumed that step St0-1 and step St0-2 described above are previously executed.

In step St1, first, the type and the total flow rate Qm of a main gas output from the main gas box 100, and a supply flow ratio (Qmc/Qme) of the processing gas to each of a central region and an edge region are input.

In the present calculation example, the main gas output from the main gas box 100 is Ar gas, and the total flow rate Qm and the supply flow ratio are set to the following values.

Total flow rate $Qm[Ar]=Qmc+Qme=1{,}000$ sccm

Supply flow ratio $(Qmc/Qme)=1.0$

The controller 2 calculates a flow rate of the main gas output to each of the central region and the edge region, based on the total flow rate Qm and the supply flow ratio (Qmc/Qme) of the Ar gas that are input.

Flow rate $Qmc[Ar]=500$ sccm

Flow rate $Qme[Ar]=500$ sccm

In step St2, flow rates Qac and Qae of the additive gases output respectively from the additive gas box 150 to the central region and the edge region are input, respectively.

In the present calculation example, the additive gas output from the additive gas box 150 to the central region is $O_2$ gas, and the additive gas output to the edge region is $C_4F_8$ gas, and the respective flow rates Qa are as follows.

Flow rate $Qac[O_2]=100$ sccm

Flow rate $Qae[C_4F_8]=5$ sccm

In step St3-1, the flow rate Qm of the main gas and the flow rate Qa of the additive gas calculated in steps St1 and St2 are converted using $N_2$ by using the flow factor acquired previously. Flow factors of Ar as the main gas, $O_2$ and $C_4F_8$ as the additive gas are as shown below in one example.

$Ar=1.1$ $O_2=1.1$ $C_4F_8=1.9$

Then, in step St3-1, a conversion flow rate of each processing gas is calculated based on the above flow factors.

Conversion flow rate $QmcN_2[Ar]=500\times1.1=550$ sccm$N_2$

Conversion flow rate $QmeN_2[Ar]=500\times1.1=550$ sccm$N_2$

Conversion flow rate $QacN_2[O_2]=100\times1.1=110$ sccm$N_2$

Conversion flow rate $QaeN_2[C_4F_8]=5\times1.9=9.5$ sccm$N_2$

As described above, in a case where the temperature difference occurs between the central region and the edge region of the substrate W that is a supply target position of the processing gas, temperature dependency may be further reflected in the calculated conversion flow rate, and the conversion flow rate may be finely adjusted/optimized (step St3-2). In other words, a temperature correction factor ΔT may be further integrated into the calculated conversion flow rates QmN$_2$ and QaN$_2$.

In the present calculation example, consideration of the temperature dependency is omitted. In other words, there is no temperature difference between the central region and the edge region of the substrate W.

In step St4, the total conversion flow rate of the processing gas supplied to the central region and the total conversion flow rate of the processing gas supplied to the edge region are respectively calculated.

Total conversion flow rate $Qc(m+a)N_2$=550+ 110=660 sccmN$_2$

Total conversion flow rate $Qe(m+a)N_2$=550+9.5≈560 sccmN$_2$

In step St5, a conversion pressure for calculating split flow of the main gas, that is, a pressure ratio serving as a reference for flow rate control is calculated based on the total conversion flow rate calculated in step St4 and the reference PQ characteristics acquired previously.

Total conversion flow rate $Qc(m+a)N_2$→conversion pressure $Pc(m+a)N_2$=25 TorrN$_2$ Total conversion flow rate $Qe(m+a)N_2$→conversion pressure $Pe(m+a)N_2$=40 TorrN$_2$ Subsequently, in step St6, the pressure ratio a serving as a reference for gas flow rate control is calculated based on the conversion pressure calculated in step St5.

Pressure ratio α=$Pc(m+a)N_2$/$Pe(m+a)N_2$=25/40=0.625

Then, during the gas processing for the substrate W, the plasma processing apparatus 1 adjusts opening of the control valve 116 such that the flow ratio Qc/Qe of the processing gases output from the splitter 120 to each of the gas diffusion chambers 15c and 15e substantially coincides with the pressure ratio α, that is, such that the flow ratio Qc/Qe=0.625.

Operation and Effect

According to the embodiment described above, a total flow rate of a main gas and an additive gas supplied to the shower head 13 is converted into a single total flow rate expressed in terms of a reference gas by using flow factors as described above. In this way, even when the types of the main gas and the additive gas are different from each other, a conversion pressure may be calculated in consideration of, for example, a difference in physical property value between these processing gases, and as a result, a flow rate of the processing gas output from the splitter 120 may be appropriately proportionally controlled.

Further, according to the technology of the present disclosure, merely by acquiring (inputting) the types of the main gas and the additive gas, and a recipe flow rate prior to the gas processing of the plasma processing apparatus 1, the amount of pressure increase due to the additive gas mixed with the main gas is grasped in advance, and thus, a split flow ratio (a pressure ratio between the central region side and the edge region side) of the main gas by the splitter 120 may be maintained to a desired value. As a result, a desired gas processing result may be appropriately obtained for the substrate W of a processing target in the plasma processing apparatus 1.

Further, according to the technology of the present disclosure, as described above, an overshoot control may be implemented for the amount of pressure increase due to the additive gas; thus, it may be expected to stabilize the pressure ratio a at a higher speed.

In the above embodiment, the nitrogen (N$_2$) gas is used as the reference gas for performing the flow rate control, but the gas used as the reference gas is not limited to the N$_2$ gas, and any gas may be used as the reference gas.

However, nitrogen (N$_2$) gas is commonly used for various plasma processing apparatuses used in semiconductor device manufacturing processes. In other words, a gas source and a gas supply line for supplying a nitrogen gas are provided in advance in various plasma processing apparatuses. For this reason, by using the nitrogen gas as the reference gas, even in the plasma processing apparatuses having different purposes, without need to install an additional gas supply line for supplying the reference gas, reference PQ characteristics and flow factors may be acquired under substantially the same conditions.

In view of this point, it is preferable to use a nitrogen (N$_2$) gas as the reference gas.

In the embodiment described above, a case where the gas supply 20 includes two gas flow paths, that is, a case where the number of split flows of the main gas in the splitter 120 is two and a processing gas is supplied independently to the two regions (central region and edge region) of the substrate W is described by way of example, but the number of gas flow paths included in the gas supply 20 is not limited thereto.

As described above, in a case where the processing gas is supplied to the three regions (central region, middle region, and edge region) of the substrate W, the gas supply 20 may include three gas flow paths. Further, in a case where the processing gas is supplied to four regions (central region, middle region, edge region, and belly edge region) of the substrate W, the gas supply 20 may include four gas flow paths.

In this way, the gas supply 20 of the plasma processing apparatus 1 according to the present disclosure may include more than one, that is, at least two or more gas flow paths, according to the number of processing gas supply regions formed in the substrate W.

In the above embodiment, a case where the additive gas is mixed with both the main gas supplied to the central region (gas diffusion chamber 15c) and the main gas supplied to the edge region (gas diffusion chamber 15e) is described by way of example, but any one of the regions where the additive gas is mixed with the main gas may be used.

That is, as described in the embodiment, the additive gas flow path may be connected to all of the more than one gas flow paths, and the additive gas may be mixed only with the main gas flowing through at least any one of the gas flow paths by opening and closing of the valve for addition disposed in the additive gas flow path.

Alternatively, the additive gas flow path may be connected to only at least any one gas flow path of the more than one gas flow paths included in the gas supply 20.

As described above, the reference PQ characteristics acquired in step St0-1 may change depending on conductance of the shower head 13 (gas diffusion chamber 15), for example, a shape of the gas diffusion chamber 15 or the number of gas introduction holes 16. Further, here, an operation of forming the gas introduction hole 16 during manufacture of the shower head 13 may cause a machining error, that is, an instrument error may occur between different shower heads 13.

In consideration of this point, it is preferable to acquire the reference PQ characteristics in step ST0-1 for each individual in the plasma processing apparatus 1 or for each individual in the shower head 13.

Further, the shower head 13 may be consumed by plasma processing repeatedly performed by the plasma processing apparatus 1, so that an average diameter and a depth of the gas introduction hole 16 may change. In other words, conductance of the shower head 13 (gas diffusion chamber 15) may change over time due to repeated plasma processing, and thus, the reference PQ characteristics may also change over time.

In consideration of this point, in the plasma processing apparatus 1, the reference PQ characteristics acquired in step St0-1 (start-up time or the like of the plasma processing apparatus 1) may be stored as "initial data" in the controller 2, and further, the reference PQ characteristics may be periodically acquired (for example, for each series of plasma processing) by the plasma processing apparatus 1. Then, by comparing the reference PQ characteristics thus periodically acquired with the "initial data" stored in the controller 2, a temporal change (amount of consumption) of the shower head 13 may be inspected; furthermore, as a result, timing for replacing the shower head 13 may be appropriately grasped.

The periodic acquisition of the reference PQ characteristics may be executed, for example, during transport of the substrate W after the plasma processing for the substrate W in the plasma processing apparatus 1 is completed. That is, PQ characteristics compared with the reference PQ characteristics as the "initial data" may be referred to as "post-processing PQ characteristic" after the gas processing of the plasma processing apparatus 1.

Further, in the above-described embodiment, flow factors serving as a reference for flow rate control are determined and finely corrected/optimized based on the type of a processing gas (step St3-1) and temperature dependency (step St3-2); however, the flow factors may also change according to conductance of the shower head 13 (gas diffusion chamber 15) like the reference PQ characteristics.

In view of this point, like the reference PQ characteristics, the flow factors of the various processing gases may also be finely adjusted/optimized for each individual of the plasma processing apparatus 1 or for each individual of the shower head 13.

In the embodiment described above, in order to appropriately implement the proportional control of the flow rate based on a pressure ratio particularly when the types of the main gas and the additive gas are different from each other, the flow rate Qm of the main gas and the flow rate Qa of the additive gas are converted using the reference gas ($N_2$) by using the flow factors (step ST3).

However, even in a case where the types of the main gas and the additive gas are different from each other, for example, in a case where there is no large difference between the physical property values of the main gas and the additive gas, or in a case where the difference between the physical property values falls within an allowable range, the reference gas conversion using the flow factors is not essential.

Specifically, instead of acquiring the reference PQ characteristics in step St0-1, the PQ characteristics of the various processing gases used for gas processing may be acquired previously.

Then, a supply flow ratio (Qmc/Qme) of various processing gases calculated by using the process recipe may be calculated, and a pressure ratio (Pc/Pe) may be calculated from the PQ characteristics corresponding to the various processing gases, and thus, proportional controls of the control valves 122c and 122e are performed by using the pressure ratio.

According to the present control example, since the pressure ratio may be directly calculated by using the PQ characteristics corresponding to various processing gases without using the reference gas, accuracy of the flow rate control may be improved compared to the above-described embodiment.

However, in this case, it is necessary to perform calculations of a supply flow ratio, a pressure ratio, and the like independently by using various processing gases, and it takes a considerable time for the flow rate control, and there is a possibility that it may not be compatible with mass production of the plasma processing apparatus 1. In view of this point, in the technology according to the present disclosure, it is preferable to perform a reference gas conversion by using flow factors, and to further perform the flow rate control by using the reference PQ characteristics.

That is, more specifically, the following embodiment may also be included in the technical scope in the technology of the present disclosure.

Without using flow factors serving as a conversion reference for the pressure P, a control may be performed to calculate an internal pressure in each of a plurality of gas supply flow paths by using the total flow rate Q calculated in each of the plurality of gas supply flow paths (in one example, the plurality of gas supply flow paths connected to each of the central region, the edge region, and the middle region of the substrate W in the above embodiment), the relationship (for example, the PQ characteristics described above) between the gas flow rate and the gas pressure of the main gas, which is acquired previously, and the relationship between the gas flow rate and the gas pressure of the additive gas, which is acquired previously.

According to the present disclosure, a gas may be appropriately supplied into a processing chamber in consideration of influence of an additive gas mixed into a main gas.

It shall be understood that the embodiments disclosed herein are illustrative and are not restrictive in all aspects. The embodiment described above may be omitted, replaced, or modified in various forms without departing from the scope and spirit of the appended claims.

What is claimed is:

1. A gas supply system for supplying a gas into a processing chamber, comprising:
    a plurality of gas supply flow paths configured to supply independently a main gas to the processing chamber;
    a flow rate control valve disposed in each of the plurality of gas supply flow paths;
    an additive gas flow path connected to a downstream side of the flow rate control valve in at least one of the plurality of gas supply flow paths;
    a valve for addition disposed in the additive gas flow path; and
    a controller for controlling operations of the flow rate control valve and the valve for addition,
    wherein the controller executes:
    a control of calculating a flow rate of the main gas flowing through each of the plurality of gas supply flow paths;

a control of acquiring a flow rate of an additive gas that flows through the additive gas flow path and is mixed with the main gas flowing through each of the plurality of gas supply flow paths;

a control of calculating a total flow rate of the flow rate of the main gas and the flow rate of the additive gas, in each of the plurality of gas supply flow paths;

a control of calculating an internal pressure of each of the plurality of gas supply flow paths by using the total flow rate calculated in each of the plurality of gas supply flow paths, a first relationship between a previously-acquired gas flow rate and a previously-acquired gas pressure of the main gas, and a second relationship between a previously-acquired gas flow rate and a previously-acquired gas pressure of the additive gas;

a control of calculating a ratio of the internal pressures calculated in each of the plurality of gas supply flow paths; and a control of proportionally controlling openings of a plurality of the flow rate control valves based on the ratio of the internal pressures.

2. The gas supply system according to claim 1, wherein the controller further executes a control of converting the flow rate of the main gas and the flow rate of the additive gas into flow rates expressed in terms of a reference gas by using a previously-acquired flow factor, and calculates the internal pressure of each of the plurality of gas supply flow paths by using the converted flow rate expressed in terms of the reference gas and a third relationship between a previously-acquired gas flow rate and a previously-acquired gas pressure of the reference gas during the control of calculating the internal pressure.

3. The gas supply system according to claim 2, wherein the plurality of gas supply flow paths are configured to supply the main gas to different gas supply regions inside the processing chamber, and the controller corrects the flow factor based on a temperature difference between the different gas supply regions.

4. The gas supply system according to claim 3, wherein the flow factor is a numerical value determined from at least one parameter among a type, a physical property value, and a temperature of the main gas, a type, a physical property value, and a temperature of the additive gas, apparatus characteristics and a temperature of the processing chamber, and apparatus characteristics and temperatures of the plurality of gas supply paths.

5. The gas supply system according to claim 4, wherein the processing chamber includes a shower head in which a plurality of gas introduction holes for introducing a processing gas into the processing chamber are formed, and the apparatus characteristics include at least any one parameter of a number, an average diameter, and depths of the plurality of gas introduction holes.

6. The gas supply system according to claim 5, wherein the controller further executes a control of acquiring the third relationship in the reference gas after completion of gas processing in the processing chamber, and a control of inspecting a temporal change in the apparatus characteristics by comparing the third relationship before execution of the gas processing with the third relationship acquired after the completion of the gas processing.

7. The gas supply system according to claim 6, wherein the reference gas is a nitrogen gas.

8. The gas supply system according to claim 7, wherein the controller includes a storage medium that stores the flow factor and information on the third relationship.

9. The gas supply system according to claim 8, wherein a total value of a pressure of the main gas and a pressure of the additive gas calculated during the control of calculating the internal pressure is twice or less compared with a primary-side pressure of the flow rate control valve.

10. The gas supply system according to claim 9, further comprising:

a flow rate controller disposed on an upstream side of the flow rate control valve and configured to control the flow rate of the main gas; and a pressure sensor disposed inside the flow rate controller and configured to measure the primary-side pressure.

11. The gas supply system according to claim 2, wherein the flow factor is a numerical value determined from at least one parameter among a type, a physical property value, and a temperature of the main gas, a type, a physical property value, and a temperature of the additive gas, apparatus characteristics and a temperature of the processing chamber, and apparatus characteristics and temperatures of the plurality of gas supply paths.

12. The gas supply system according to claim 2, wherein the controller further executes a control of acquiring the third relationship in the reference gas after completion of gas processing in the processing chamber, and a control of inspecting a temporal change in the apparatus characteristics by comparing the third relationship before execution of the gas processing with the third relationship acquired after the completion of the gas processing.

13. The gas supply system according to claim 2, wherein the reference gas is a nitrogen gas.

14. The gas supply system according to claim 2, wherein the controller includes a storage medium that stores the flow factor and information on the third relationship.

15. The gas supply system according to claim 1, wherein a total value of a pressure of the main gas and a pressure of the additive gas calculated during the control of calculating the internal pressure is twice or less compared with a primary-side pressure of the flow rate control valve.

16. A plasma processing apparatus for processing a substrate, comprising:

a processing chamber;

a substrate support disposed inside the processing chamber;

the gas supply system according to claim 1 that is configured to supply a gas into the processing chamber; and a plasma generator configured to generate plasma from the gas in the processing chamber.

17. A gas supply method using a gas supply system, the gas supply system including:

a plurality of gas supply flow paths configured to supply independently a main gas to a processing chamber;

a flow rate control valve disposed in each of the plurality of gas supply flow paths;

an additive gas flow path connected to a downstream side of the flow rate control valve in at least one of the plurality of gas supply flow paths to mix an additive gas with the main gas, a valve for addition disposed in the additive gas flow path; and a storage medium that stores a reference relationship between a previously-acquired gas flow rate and a previously-acquired gas pressure of a reference gas in each of the plurality of gas supply flow paths, and flow factors of the main gas and the additive gas, the gas supply method comprising:

calculating a flow rate of the main gas flowing through each of the plurality of gas supply flow paths;

acquiring a flow rate of the additive gas that flows through the additive gas flow path and is mixed with the main gas flowing through each of the plurality of gas supply flow paths;

calculating a total flow rate of the flow rate of the main gas and the flow rate of the additive gas, in each of the plurality of gas supply flow paths;

converting the flow rate of the main gas and the flow rate of the additive gas into flow rates expressed in terms of the reference gas by using the flow factors, respectively;

calculating a total conversion flow rate of the converted flow rate of the main gas in terms of the reference gas and the converted flow rate of the additive gas in terms of the reference gas, in each of the plurality of gas supply flow paths;

calculating an internal pressure in each of the plurality of gas supply flow paths by using the total conversion flow rate and the reference relationship;

calculating a ratio of the internal pressures calculated in each of the plurality of gas supply flow paths; and proportionally controlling openings of a plurality of the flow rate control valves based on the ratio of the internal pressures to supply the main gas from each of the plurality of gas supply flow paths into the processing chamber.

* * * * *